United States Patent [19]

Ikebe et al.

[11] Patent Number: 4,928,009
[45] Date of Patent: May 22, 1990

[54] DEFLECTION-INSENSITIVE OPTICAL ROTARY ENCODER

[75] Inventors: Yo Ikebe; Hideaki Oku, both of Yamanashi, Japan

[73] Assignee: Fanuc Ltd., Yamanashi, Japan

[21] Appl. No.: 369,559

[22] PCT Filed: Aug. 19, 1988

[86] PCT No.: PCT/JP88/00825
§ 371 Date: Apr. 13, 1989
§ 102(e) Date: Apr. 13, 1989

[87] PCT Pub. No.: WO89/01608
PCT Pub. Date: Feb. 23, 1989

[30] Foreign Application Priority Data

Aug. 20, 1987 [JP] Japan .................. 62-205147

[51] Int. Cl.$^5$ .............................................. G01D 5/34
[52] U.S. Cl. .................. 250/231.13; 250/237 G; 250/231.14; 356/152
[58] Field of Search ............... 250/231 SE, 237 G; 33/707

[56] References Cited

U.S. PATENT DOCUMENTS

| | | |
|---|---|---|
| 4,108,539 | 8/1978 | Gort et al. |
| 4,266,125 | 5/1981 | Epstein et al. ............... 250/231 SE |
| 4,593,193 | 6/1986 | Michaelis ..................... 250/231 SE |

FOREIGN PATENT DOCUMENTS 62-09842  3/1987  Japan .

Primary Examiner—David C. Nelms
Assistant Examiner—Khaled Shami
Attorney, Agent, or Firm—Armstrong, Nikaido, Marmelstein, Kubovcik & Murray

[57] ABSTRACT

In an optical rotary encoder which detects the angle of rotation of a rotary shaft by detecting the ray of light transmitting through an angle detection pattern formed on a rotary disc coupled to the rotary shaft, a deflection detection pattern (20b) is disposed on the rotary disc separately from the angle detection pattern and the direction and magnitude of deflection of the rotary shaft with respect to the center of a bearing is detected by detecting the change in the quantity of light passing through the deflection detection pattern (20b). The angle of rotation thus detected is corrected to the angle of rotation around the axis of the rotary shaft.

9 Claims, 7 Drawing Sheets

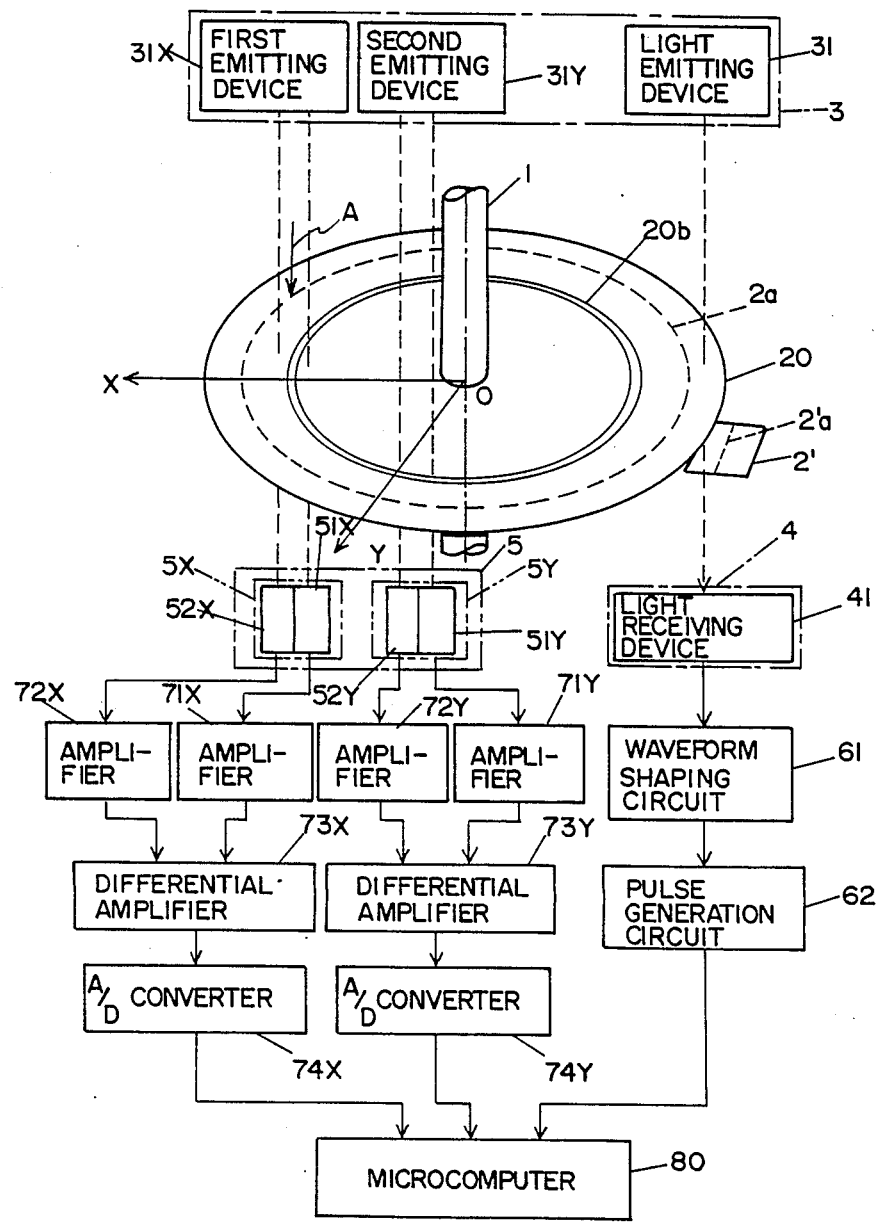

DEFLECTION-INSENSITIVE OPTICAL ROTARY ENCODER

DESCRIPTION

1. Technical Field

This invention relates to a deflection-insensitive optical rotary encoder, wherein a particular optical rotary encoder is used to detect deflection of a rotary shaft from the center of a bearing in order to correct detected values of a rotation angle of the rotary shaft in accordance with the deflection.

2. Background Art

Recently, as accuracy of positioning, etc., in processing with a machine tool has been improved, a rotation angle detection apparatus of high-resolution and high-accuracy has been required. Conventionally, an optical rotary encoder is generally known as an apparatus for detecting a rotation angle with high-resolution and high-accuracy. This type of optical rotary encoder detects a rotation angle around a rotary shaft by providing an angle detection pattern on a rotary disk which is coupled to the rotary shaft and by detecting a ray of light having penetrated the angle detection pattern at a rotation angle detector.

In above described optical rotary encoder, however, there is a defect in that it cannot detect an accurate rotation angle because the rotary disk deflects when the rotary shaft deflects from the center of the bearing due to the influence of an external force.

To improve on this defect, an optical rotary encoder having a function of correcting the deflection was proposed in unexamined Patent Publication (Kokai) No. 61-029021. The optical rotary encoder in this publication comprises another rotation angle detector (called the second rotation detector), which is the same as the rotation angle detector (called the first rotation detector) provided in a conventional optical rotary encoder, in a symmetrical position with respect to the rotation axis, and calculates an arithmetical mean of the rotation angles which are detected in the first rotation detector and the second rotation detector, respectively. In this way, as errors of the rotation angles due to the deflection of the rotary shaft included in the respective detected rotation angles are arithmetically averaged to be canceled out, a corrected rotation angle around the center of the bearing of the rotary shaft (referring this center to an imaginary center) is obtained.

In the optical rotary encoder described in the above publication, however, the corrected rotation angle is not a rotation angle with respect to the center of the rotary shaft but to an imaginary center of the bearing, and as direction and magnitude of deflection are not detected for the reason that contribution of the deflection of the rotary shaft is canceled out, a problem arises in that it cannot deal with ultra-accurate processing in a machine tool.

DISCLOSURE OF THE INVENTION

An object of the present invention is to provide a deflection-insensitive optical rotary encoder which can detect deflection of a rotary shaft from a center of a bearing to be able to detect a rotation angle around the axis of the rotary shaft despite the deflection.

According to the invention, there is provided a deflection-insensitive optical rotary encoder comprising a rotary disk which is coupled to a rotary shaft, a light reception part for detecting an angle which receives only a ray of the light having penetrated an angle detection pattern which is formed on said rotary disk among the light emitted from a light source, and an angle detection part which detects a rotation angle of said rotary shaft according to an output signal from said light reception part for detecting an angle, characterized in that the encoder further comprises a deflection detection pattern which is formed on said rotary disk and which varies in intensity of light penetration depending on deflection of said rotary shaft, a light reception part for detecting deflection whose output signal is varied depending on variation of said intensity of penetration light, a deflection detection part which detects the deflection of said rotary shaft according to the variation of the output signal of said light reception part for detecting deflection, and a calculation part which corrects the rotation angle which is detected by said angle detection part according to the deviation of said rotary shaft.

BRIEF EXPLANATION OF THE DRAWINGS

FIG. 3 is a block diagram showing an embodiment of the invention;

BEST MODE FOR CARRYING OUT THE INVENTION

Before description of an embodiment of a deflection-insensitive optical rotary encoder according to the present invention, a conventional optical rotary encoder which is generally used is described with reference to FIG. 1.

Figure 1:
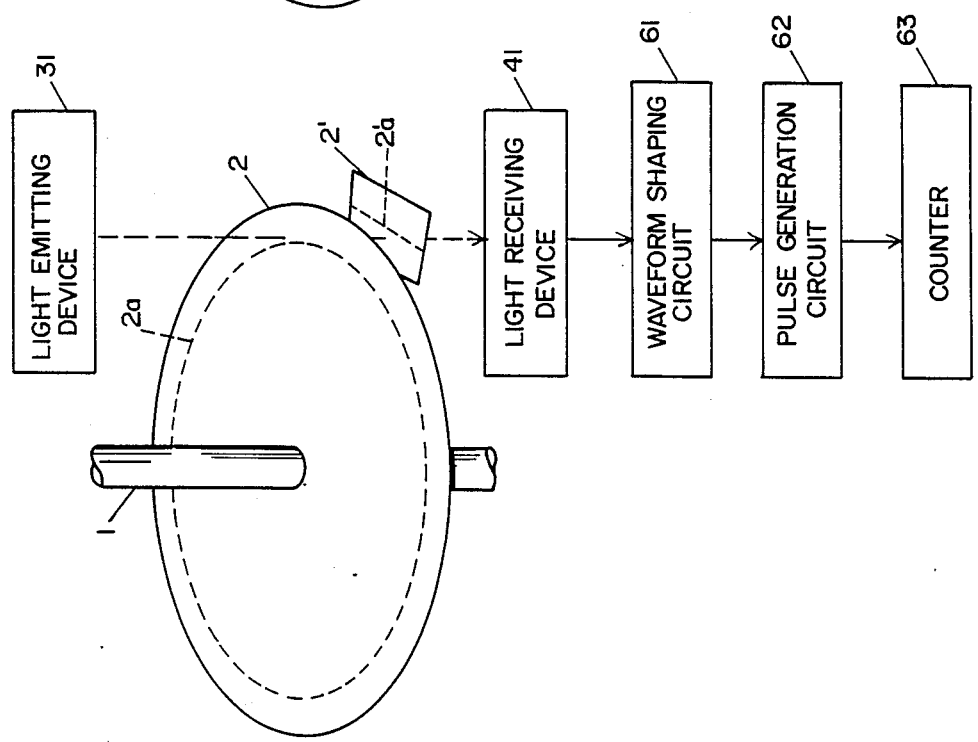
FIG. 1 is a block diagram briefly representing the construction of a conventional optical rotary encoder.

FIG. 1 is a block diagram representing a brief construction of a conventional optical rotary encoder. In this figure, 1 is a rotary shaft which is coupled to a rotary disk 2. On the rotary disk 2, for example, a group of equally spaced slits is formed in a concentric circle around a center of rotary shaft 1, as a pattern 2a. Below the angle detection pattern 2a, there is provided a fixed plate 2' with an angle detection subpattern 2'a, and there is also provided a light emitting device 31 and light receiving device 41 on the opposite side of the angle detection subpattern 2'a. 62 is a pulse signal generation circuit, which generates a spaced pulse signal dependent on a signal which is output by the light receiving device 41 and whose waveform is shaped in a waveform shaping circuit 61. 63 is a counter, which counts the pulsed signal.

In above arrangement, as the rotary disk 2 rotates with rotation of the rotary shaft 1, light emitted from the light emitting device 31 penetrates the angle detection pattern 2a onto the rotary disk 2. The light receiving device 41 receives the ray of the light from the angle detection pattern 2a penetrating the angle detection subpattern 2'a so that the light receiving device 41 generates a signal dependent on intensity of the penetrating light, and a wave form of the signal is shaped in the wave form shaping circuit 61 to be introduced in the pulse signal generation circuit 62. The pulse signal generation circuit 62 outputs a spaced pulse signal to the counter 63 depending on the output signal from the waveform shaping circuit 61, and the counter 63 counts this pulse signal. Thus, a rotation angle around the rotary shaft 1 is detected.

However, as an accurate rotation angle cannot be detected in the above optical rotary encoder when the rotary shaft deflects from the center of the bearing, the deflection of the shaft cannot be neglected, out of consideration for the influence of the deflection on accuracy in processing, in processing with a machine tool where a high-accuracy of positioning, etc., is required. Therefore, it is required to detect the deflection of the rotary shaft in order to correct the detected values of the rotation angle around the rotary shaft depending on the deflection and to detect the rotation angle around the axis of the rotary shaft.

Preferred embodiments of the deflection-insensitive optical rotary encoder according to the present invention will now be described with reference to the accompany drawings as follows.

Figure 2:
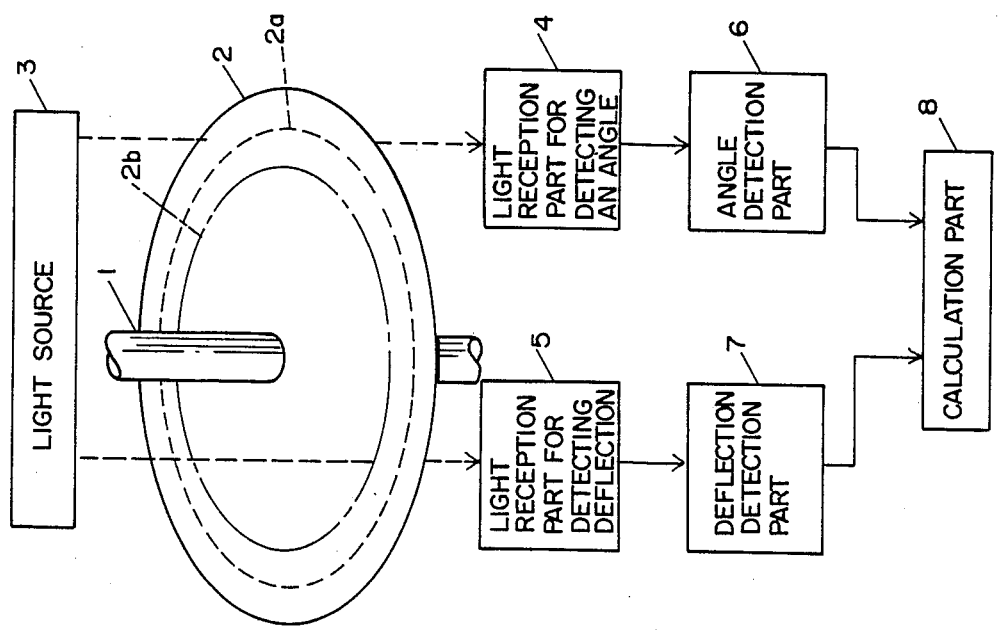
FIG. 2 is a block diagram representing the basic construction of a deflection-insensitive optical rotary encoder according to the present invention.

FIG. 2 is a block diagram representing basic construction of the deflection-insensitive optical rotary encoder according to the present invention. In this figure, 1 is a rotary shaft, which is coupled to a rotary disk 2. The aforementioned angle detection pattern 2a as well as a deflection detection pattern 2b to detect deflection of the rotary shaft 1, are formed on the rotary disk 2. 4 is a light reception part for detecting an angle, which receives only the light having penetrated the angle detection pattern 2a among light emitted from a light source 3. 5 is a light reception part for detecting deflection, whose output signal varies depending on variation of intensity of the light penetrating the deflection detection pattern 2b among the light emitted from the light source 3, 6 is an angle detection part which detects a rotation angle according to an output signal from the light reception part for detecting an angle 4. 7 is a deflection detection part, which detects deflection of the rotary shaft 1 from the center of a bearing according to the variation. 8 is a calculation part, which corrects the rotation angle which is detected by the angle detection part 6, according to the deflection of the rotary shaft 1 which is detected by the deflection detection part 7.

In above construction, as the rotary shaft 1 deflects, the deflection detection pattern 2b also deflects, thus, the intensity of the penetration light among the light emitted from the light source 3 is varied depending on the deflection of the deflection detection pattern 2b. Thus, the output signal of the light reception parts for detecting deflection is also varied, and the deflection detection part 7 detects the deflection of the rotary shaft 1 according to variation of the output signal. On the other hand, light reception part 4 for detecting an angle receives the light penetrating the angle detection pattern 2a among the light emitted from light source 3, and sends an output signal to the angle detection part 6. The angle detection part 6 detects the rotation angle according to the output signal of the light reception part 4 for detecting an angle. The calculation part 8 corrects the detected rotation angle according to the deflection of the rotary shaft 1 detected in the deflection detection part 7. Thus, the rotation angle around the axis of the rotary shaft 1 is obtained. FIG. 3 is a block diagram showing an embodiment of the invention. In this figure, 20 is a glass disk as the rotary disk 2, which is coupled to the rotary shaft 1. On the glass disk 20, a pattern for screening light, which is, for example, equally spaced and radial from the center of the rotary shaft 1, is formed as the angle detection pattern 2a. Adding to the angle detection pattern 2a, a circular pattern for screening light 20b, which is, for example, concentric from the center of the rotary shaft 1, is formed as the deflection detection pattern 2b, on the glass disk 20. 31X and 31Y are a first light emitting device and a second light emitting device, respectively, which constitute the light source 3 with aforementioned light emitting device 31. 5X and 5Y are a first light receiver and a second light receiver, respectively, which are respectively aligned to an X direction and a Y direction orthogonally to each other from the center O of the bearing, and which are arranged on opposite sides of the circular pattern 20 from the first light emitting device 31X and the second light emitting device 31Y, respectively. The first light receiver 5X and the second light receiver 5Y comprise a light penetration receiving device 51X and a light brightness receiving device 52X, and a light penetration receiving device 51Y and a light brightness receiving device 52Y, respectively, and constitute a light reception part for detecting deflection. 71X, 71Y, 72X, and 72Y are amplifiers which amplify output signal of light receiving devices 51X and 51Y and light brightness receiving devices 52X and 52Y. 73X and 73Y are differential amplifiers. The differential amplifier 73X measures the level difference between the output signals of the light penetration receiving device 51X and the light brightness receiving device 52X, and the differential amplifier 73Y measures the level difference between the output signals of the light penetration receiving device 51Y and the light brightness receiving device 52Y. 74X and 74Y are A/D converters which convert respective output signals of the differential amplifiers 73X and 73Y to provide a digital signal to a microcomputer 80. Microcomputer 80 comprises a CPU, RAM and ROM, etc., detects deflection of the rotary shaft 1 toward an X direction and a Y direction from digital values which are provided by the A/D converters 74X and 74Y, and corrects detected values of a rotation angle to values of a rotation angle around the axis of the rotary shaft 1 in accordance with the deflection. In the above, the detected values of a rotation angle are detected in a similar construction to the conventional rotary encoder shown in FIG. 1. Therefore, similar constituents to that of FIG. 1 are shown by the same reference numerals. In FIG. 3, light emitting device 31 and light receiving device 41 are aligned in an X direction and arranged on opposite sides of the first light emitting device 31X and the first light receiving device 51X. Additionally, the pulse signal from the pulse generation circuit 62 is counted in a counter 63 in a conventional optical rotary encoder, while it is counted in an internal counter of the microcomputer 80 in this embodiment.

Figure 4:
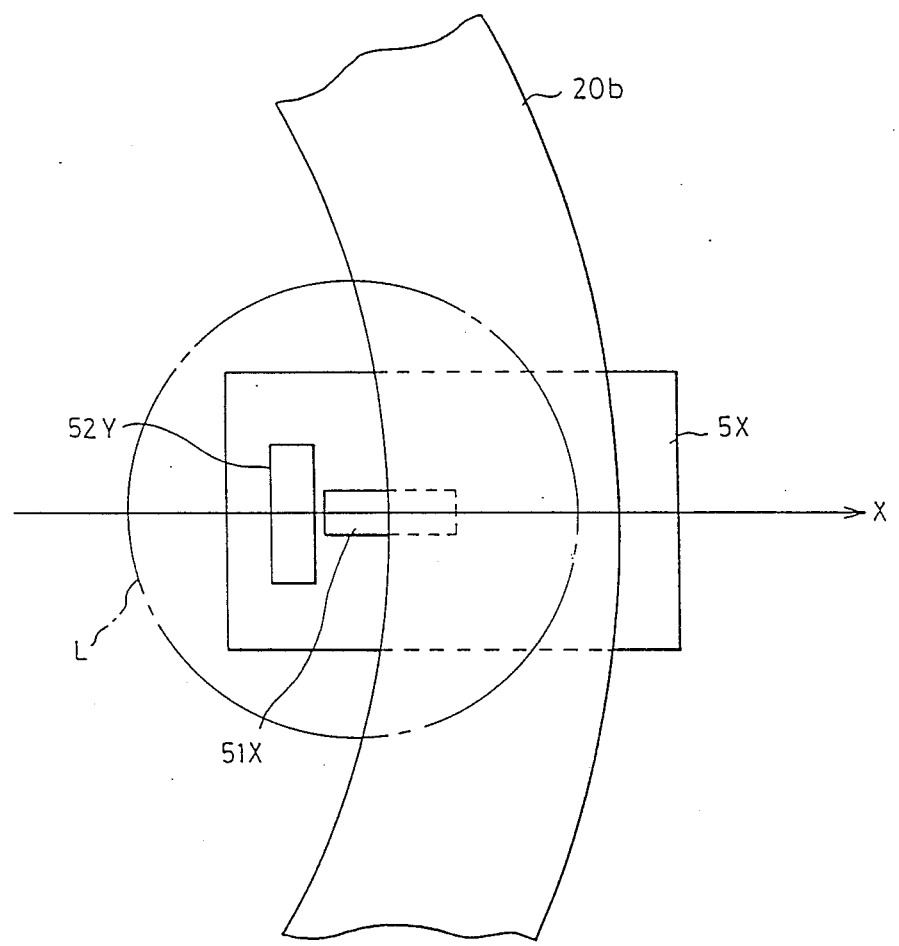
FIG. 4 is a diagram showing a concrete arrangement viewed from arrow A of FIG. 3.

FIG. 4 is a diagram showing a concrete arrangement in an X direction viewed from arrow A of FIG. 3, and the arrangement in a Y direction can also be shown similarly. This figure shows that as the circular pattern 20b deflects from the light penetration receiving device 51X due to deflection of the rotary shaft 1, intensity of light penetration in the light penetration receiving device 51X varies within a light emitting area L. On the other hand, light brightness receiving device 52X always detects the brightness of the emitted light in order to compensate the variation of brightness of the light emitted from the first light emitting device 31 due to temperature and deterioration due to age.

Figure 5:
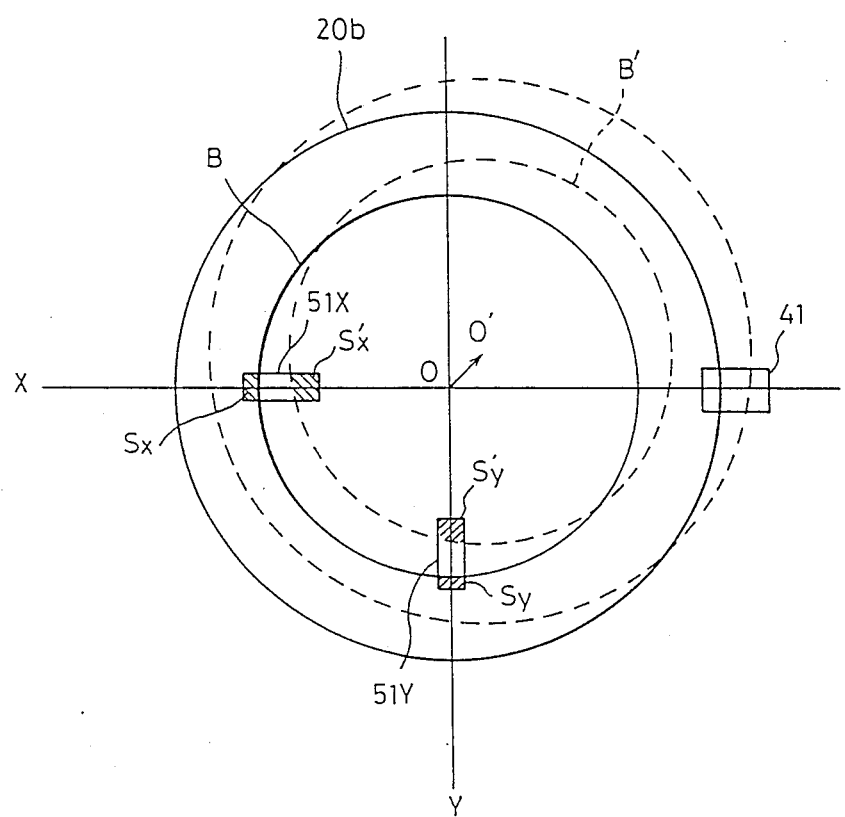
FIG. 5 is a diagram for explaining movement in the embodiment of the invention.

The operation of above construction is now described. In this embodiment, for example, as shown in FIG. 5, when the center O' of rotary shaft 1 does not deflect from the center O of the bearing light penetrating to the area Sx of the light receiving device 51X is screened by the circular pattern 20b, while when the center O' of the rotary shaft 1 deflects from the center O of the bearing only the area S'$_X$ of the light receiving device 51X receives the penetrating light. On the other hand, in the light penetration receiving device 51Y, when the center O' of the rotary shaft 1 does not deflect from the center O' of the bearing light penetrating to the area S'$_Y$ of the light receiving device 51X is screened by the circular pattern 20b, while when the center O' of the rotary shaft 1 deflects from the center O of the bearing only the area S'$_Y$ of the light receiving device 51Y receives the penetration light. Thus, the intensity of the penetrating light on light receiving devices 51X and 51Y varies depending on deflection of the center O' of the rotary shaft 1 from the center O of the bearing. Accordingly, output signals of these light receiving devices also vary, and these varied output signals are amplified to be provided to the differential amplifiers 73X and 73Y. On the other hand, the light brightness receiving devices 52X and 52Y are always detecting the brightness of the light emitted from the respective first light emitting device 31X and second light emitting device 31Y, and the output signals of the light receiving devices are also provided to the differential amplifiers 73X and 73Y. The differential amplifier 73X measures the level difference between the output signals of the light penetration receiving device 51X and the light brightness receiving device 52X, and the difference is A/D converted in A/D converter 74X to be provided to the microcomputer 80 as a deflection signal in an X direction. On the other hand, the differential amplifier 73Y measures the level difference between the output signals of the light penetration receiving device 51Y and the light brightness receiving device 52Y, and the difference is A/D converted in A/D converter 74Y to be provided to the microcomputer 80 as a deflection signal in a Y direction. At this time, a rotation angle is detected in a similar manner to the conventional optical rotary encoder. Namely, light emitted from the light emitting device 31 penetrates the angle detection pattern 2a on the glass disk 20 and the angle detection subpattern 2'a on the fixed plate 2', and the penetration light is received by the light receiving device 41 to generate an output signal. The output signal of the light receiving device 41 is passed through the waveform shaping circuit 61 and pulse signal generation circuit 62 to generate a pulsed signal, which is introduced into the microcomputer 80. In the microcomputer 80, the digital values of the deflection signals in an X direction and the deflection signal in a Y direction and the pulsed signal of the rotation angle are counted to detect deflection of the rotary shaft 1 toward an X direction and a Y direction and a rotation angle. So that the rotation angle is corrected in accordance with the deflection toward an X and Y direction.

Figure 6:
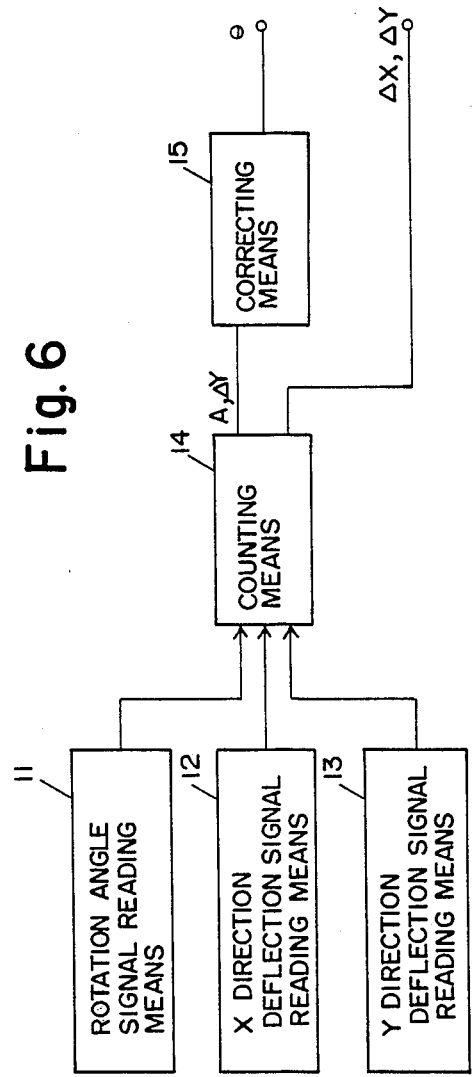
FIG. 6 is a block diagram showing construction of operation of a microcomputer 80.

Operation of the microcomputer 80 is described with reference to FIG. 6 as follows. FIG. 6 is a block diagram showing construction of the microcomputer 80.

In this figure, 11 is rotation angle signal reading means, which reads pulsed signals from the pulse generation circuit 62 as a rotation angle. 12 is an X direction deflection signal reading means, which reads an X directional deflection signal from the A/D converter 74X. 13 is a Y direction signal reading means, which reads a Y directional deflection signal from the A/D converter 74Y. 14 is a counting means which counts digital values from the rotation angle signal reading means 11, X direction deflection signal reading means 12, and Y direction deflection signal reading means 13 to obtain X directional deflection $\Delta X$, $\Delta Y$ directional deflection $\Delta Y$, and a rotation angle A including a deflection error. 15 is a correcting means which corrects the rotation angle A according to the X directional deflection $\Delta X$ and Y directional deflection $\Delta Y$ ($\theta$ shown in FIG. 6 represents a corrected rotation angle).

A procedure of the microcomputer 80 is described with reference to a flow chart shown in FIG. 7 based on the above construction. Though the flow diagram shows the procedure when direction of deflection and a rotation angle of rotary shaft 1 are positive, the same procedure applies to the case where both the direction of deflection and the rotation angle of rotary shaft 1 are negative or one of the two is negative, if we correct it as the internal counter of microcomputer 80 is decremented.

In this figure, firstly if a switch (not shown) which operates the deflection-insensitive optical rotary encoder is activated, an initializing process for resetting of each of the registers and counters, etc., in the CPU is executed in step 701, and the procedure is advanced to step 702.

In step 702, reading of the X directional deflection signal from the A/D converter 74X is started, and then the procedure is advanced to step 703. In step 703, a value C of an internal counter is set to zero, and then the procedure is advanced to step 704. In step 704, $\Delta X$ is set as $\Delta X = C$ using the current value C of the counter, and then the procedure is advanced to step 705. In step 705, it is determined whether the reading of the X directional deflection signal has been completed, and if the reading has been completed the procedure is advanced to step 707. On the other hand, if the reading is not completed the procedure is advanced to step 706, and the value C of the counter is incremented and the procedure is then returned to step 704. Thus, the digital value of the X directional deflection signal is counted. In step 707, reading of the Y directional deflection signal from the A/D converter 74Y is started, and then the procedure is advanced to step 708. In step 708, a value C of an internal counter is set to zero, and then the procedure is advanced to step 709. In step 709, $\Delta Y$ is set as $\Delta Y = C$ using the current value C of the internal counter, and then the procedure is advanced to step 710. In step 710, it is determined whether the reading of the Y directional deflection signal has been completed, and if the reading has been completed the procedure is advanced to step 712. On the other hand, if the reading is not completed the procedure is advanced to step 711, and the value C of the counter is incremented and the procedure is then returned to step 709. Thus, the digital value of the Y directional deflection signal is counted. In step 712, reading of the rotation angle signal from the pulse generation circuit 62 is started, and then the procedure is advanced to step 713. In step 713, a value C of an internal counter is set to zero, and then the procedure is advanced to step 714. In step 714, A is set as $A = C$ using current value C of the internal counter, and then the procedure is advanced to step 715. In step 715, it is determined whether the reading of the rotation angle signal has been completed, and if the reading have been completed the procedure is advanced to step 717. On the other hand, if the reading is not completed the procedure is advanced to step 716, and the value C of the counter is incremented and the procedure is then returned to step 714. Thus, the digital value of the rotation angle signal is counted.

In step 717, the rotation angle A is corrected according to the X directional deflection ΔX and the Y directional deflection which have already been obtained. Namely, a corrected rotation angle $\theta$ is obtained in accordance with a formula $\theta = A + F(\Delta X, \Delta Y)$. Thus, the rotation angle around the axis of the shaft 1 is obtained. In the above formula, $F(\Delta X, \Delta Y)$ is a term for correction, which is a function of ΔX and ΔY (mentioned later). Aforementioned steps 701 to 717 represent one cycle of the procedure, which can be executed continuously.

Figure 8:
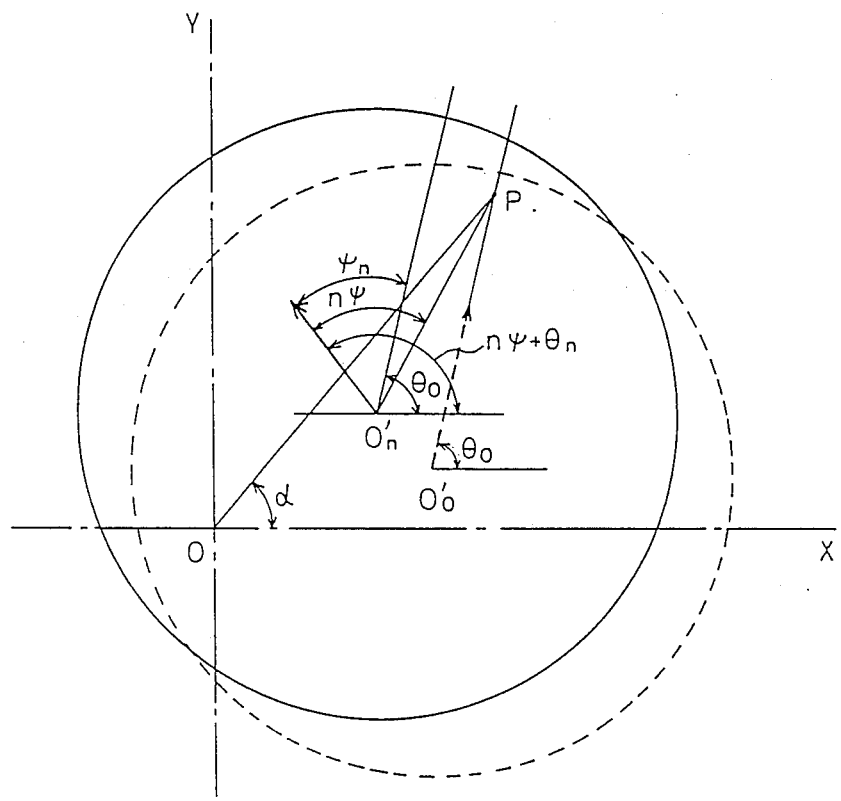
FIG. 8 is a diagram for explaining a correction method of the detected value of a rotation angle.

The above term for correction is described with reference to FIG. 8. The reference symbols in this figure represent the following:

O: a point representing the center of the bearing for rotary shaft 1

P: rotation angle detecting point (fixed as to the bearing)

α: an angle between a line segment which connects the center O of the bearing with the rotation angle detecting point P and the X axis O'o: a point representing a center of rotary shaft 1 when t=0

$\theta_0$: an angle between a line segment PO'o and the X axis

O'n: a point representing the center of the rotary shaft 1 when t=tn

ΔXn: X axis component of the point in the center of the rotary shaft 1 (when t=tn) regarding the center O of the bearing ΔYn: Y axis component of the point in the center of the rotary shaft 1 (when t=tn) regarding the center O of the bearing nφ: detected value of a rotation angle detected in the rotation angle detecting point when t=tn (where φ represents a unit angle of the detected value of a rotation angle)

In above constituents, if the center of the rotary shaft 1 moves from the point O'o (when t=O', that is, initial point of the rotary shaft 1) to O'n (when t=tn) regarding the center O of the bearing, a rotation angle $\psi_n$ around the rotary shaft 1 when t=tn is corrected as follows:

$$\psi_n = (n\phi + \theta_n) - (0 \times \phi + \theta_0)$$
$$= n\phi + \theta_n - \theta_0,$$

where $\theta_n$ is $\tan \theta_n = \dfrac{R\sin\alpha - \Delta x_n}{R\cos\alpha - \Delta y_n}$, And $\theta_n$ is $\tan \theta_0 = \dfrac{R\sin\alpha - \Delta x_0}{R\cos\alpha - \Delta y_0}$.

R is a distance from the center O of the bearing to the rotation detecting point P. Thus, the term for correction ΔF (Δx, Δy) shown in the flow diagram of FIG. 7 corresponds to a digital value of the term $\theta_n - \theta_0$ in the above equation, and the rotation angle A corresponds to a digital value of the term nφ in the above equation.

Figure 7:
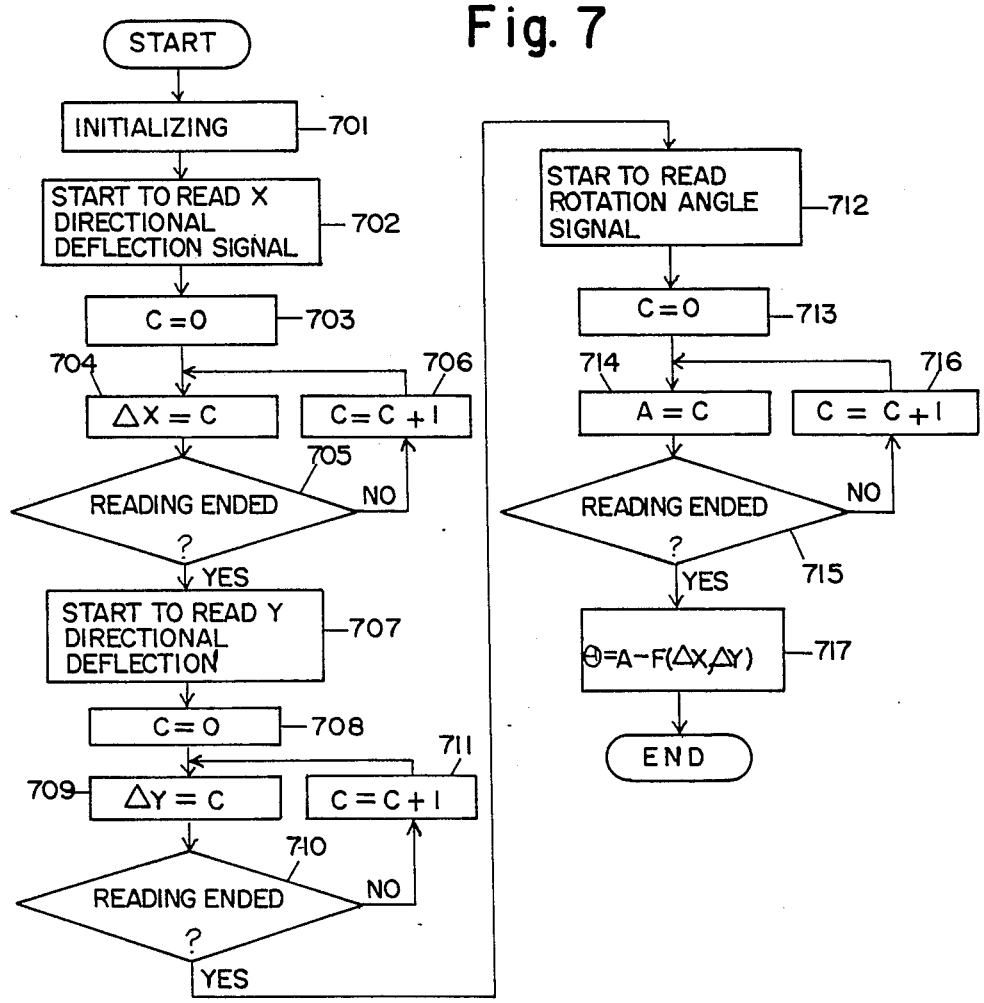
FIG. 7 is a flow chart showing processing operation of the microcomputer 80.

Furthermore, though the microcomputer 80 is used for the processes in FIG. 7, these processes can be carried out by hardware counters.

As mentioned above, in accordance with the present invention, a rotation angle around the axis of the rotary shaft can be obtained by providing a deflection detection pattern on the rotary disk which is coupled to the rotary shaft, by detecting deflection of the rotary shaft according to variation of intensity of penetration light penetrating the pattern, and by then correcting it.

We claim:

1. A deflection-insensitive optical rotary encoder comprising a rotary disk (2) which is coupled to a rotary shaft (1), a light reception angle detecting part (4) which receives only a ray of light having penetrated an angle detection pattern (2a) which is formed on said rotary disk (2) among the light emitted from a light source (3), and an angle detection part (6) which detects a rotation angle of said rotary shaft (1) according to an output signal from said light reception angle detecting part (4), characterized in that the encoder further comprises:

a circular pattern (20b) which is formed as a concentric circle with a regard to the center of said rotary shaft (1) on said rotary disk (2) and which varies the intensity of penetrating light from said light source (3) depending on deflection of said rotary shaft (1), a light reception part for detecting deflection (5) whose output signal is varied depending on variation of said intensity of penetrating light, a deflection detection part (7) which detects the deflection of said rotary shaft (1) according to the variation of the output signal of said light reception part for detecting deflection (5), and a calculation part (8) which corrects the rotation angle which is detected by said angle detection part (6) to a rotation angle around the axis of said rotary shaft (1) depending on the deflection detected by said deflection detecting part (7).

2. A deflection-insensitive optical rotary encoder as claimed in claim 1, wherein said light reception part for detecting deflection (5) comprises a first light receiver (5X) and a second light receiver (5Y) which have a first direction and a second direction respectively which are orthogonal to each other with respect to a center (O) of a bearing of said rotary shaft (1), and which are provided below said circular pattern (20b).

3. A deflection-insensitive optical rotary encoder as claimed in claim 2, wherein said deflection detection part (7) comprises a first deflection detection part which detects deflection of said rotary shaft (1) toward said first direction according to an output signal of said first light receiver (5X), and a second deflection detection part which detects deflection of said rotary shaft (1) toward said second direction according to an output signal of said second light receiver (5Y).

4. A deflection-insensitive optical rotary encoder as claimed in claim 2, wherein both said first light receiver (5X) and said second light receiver (5Y) comprise a light brightness receiving device (52X, 52Y) to detect brightness of light emitted from said light source (3), and a light penetration receiving device (51X, 51Y) to receive a ray of said penetration light.

5. A deflection-insensitive optical rotary encoder as claimed in claim 4, wherein both said first deflection detection part and said second deflection detection part comprise a differential amplifier (73X, 73Y) which measures a level difference between output signals of said light penetration receiving device (51X, 51Y) and said light brightness receiving device (52X, 52Y).

6. A deflection-insensitive optical rotary encoder as claimed in claim 1, wherein said calculation part (8) comprises a deflection signal reading means (12, 33) which reads a deflection signal from said deflection detection part (7), a rotation angle signal reading means (11) which reads a rotation angle signal from said angle detection part (6), a counting means (14) which counts digital values from said deflection signal reading means (12, 13) and said rotation angle signal reading means (11) respectively, and a correcting means (15) which corrects a rotation angle which is counted in said counting means (14) depending on a deflection which is counted in said counting means (14).

7. A deflection-insensitive optical rotary encoder as claimed in claim 6, wherein said calculating means (8) comprises a microcomputer (80).

8. A deflection-insensitive optical rotary encoder as claimed in claim 3, wherein said light source (3) comprises a light emitting device (31) which is arranged on an opposite side of said angle detection pattern (2a) from said light reception angle detecting part (4), a first light emitting device (31X) which is arranged on an opposite side of said circular pattern (20b) from said first light receiver (5X), and a second light emitting device (31Y) which is arranged on an opposite side of said circular pattern (20b) from said second light receiver (5Y).

9. A deflection-insensitive optical rotary encoder as claimed in claim 1, wherein said rotary disk (2) comprises a glass disk for light penetration (20).

* * * * *